United States Patent
Fort et al.

(10) Patent No.: US 8,588,021 B2
(45) Date of Patent: *Nov. 19, 2013

(54) SENSE AMPLIFIER APPARATUS AND METHODS

(75) Inventors: Jimmy Fort, Aix en Provence (FR); Thierry Soude, Marseilles (FR); Nicolas Zammit, Aix en Provence (FR)

(73) Assignee: Atmel Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/584,265

(22) Filed: Aug. 13, 2012

(65) Prior Publication Data

US 2012/0300567 A1 Nov. 29, 2012

Related U.S. Application Data

(63) Continuation of application No. 12/492,003, filed on Jun. 25, 2009, now Pat. No. 8,270,242.

(51) Int. Cl.
*G11C 7/02* (2006.01)

(52) U.S. Cl.
USPC .. 365/207; 365/203; 365/185.21; 365/189.07

(58) Field of Classification Search
USPC .......................... 365/207, 203, 185.21, 189.07
See application file for complete search history.

(56) References Cited

U.S. PATENT DOCUMENTS

| | | | |
|---|---|---|---|
| 6,191,979 | B1 | 2/2001 | Uekubo |
| 6,608,787 | B1 | 8/2003 | Daga et al. |
| 8,270,242 | B2 * | 9/2012 | Fort et al. ...................... 365/207 |
| 2005/0201169 | A1 | 9/2005 | Demange et al. |
| 2007/0133316 | A1 | 6/2007 | Maejima et al. |

* cited by examiner

*Primary Examiner* — Toan Le
(74) *Attorney, Agent, or Firm* — Fish & Richardson P.C.

(57) ABSTRACT

Some embodiments include apparatus and methods having a sense amplifier unit, a supply node to receive a supply voltage, and a line coupled to a memory cell of a device. The sense amplifier unit includes a circuit path coupled between the supply node and the line to carry a current having a value based on a value of information stored in the memory cell. Additional embodiments are disclosed.

17 Claims, 4 Drawing Sheets

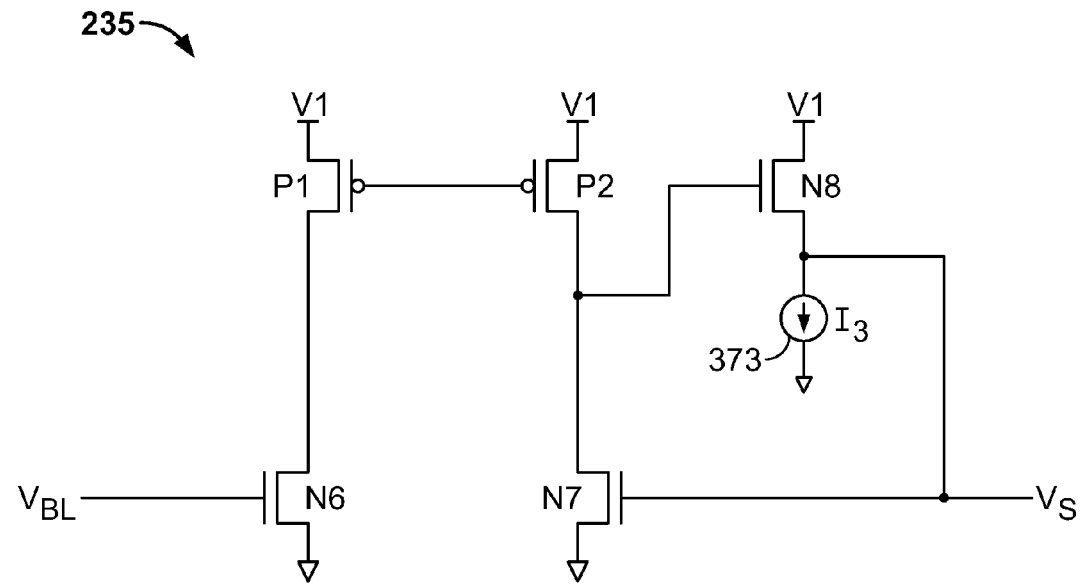
FIG. 3
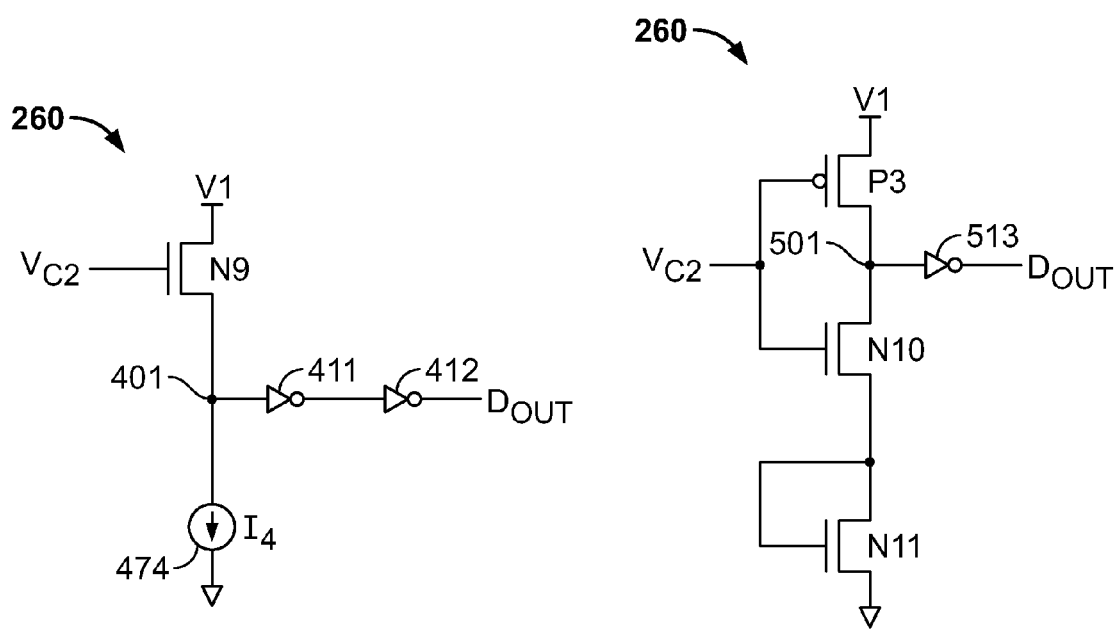
FIG. 4
FIG. 5

US 8,588,021 B2

SENSE AMPLIFIER APPARATUS AND METHODS

CROSS-REFERENCE TO RELATED APPLICATIONS

This application is a continuation of U.S. application Ser. No. 12/492,003, filed on Jun. 25, 2009, the disclosure of which is expressly incorporated herein by reference in its entirety.

BACKGROUND

Many electronic products have semiconductor devices, such as processors, microcontrollers, and memory devices. These devices often have numerous memory cells to store data and other information. The information transferred to and from the memory cells is normally represented by electrical signals. Many of these devices usually have sense amplifiers. During retrieval of information from the memory cells, the sense amplifiers sense the signals and amplify them to appropriate values to reflect the values of information stored in the memory cells. These semiconductor devices are often designed to operate at a specific operating supply voltage range. Some applications using these devices may employ a different supply voltage range. Therefore, designing sense amplifiers for some of these applications may become a challenge.

BRIEF DESCRIPTION OF THE DRAWINGS

FIG. 3 shows an example of an operational amplifier of FIG. 2, according to an example embodiment of the invention.

FIG. 4 shows an example of an output circuit of FIG. 2, according to an embodiment of the invention.

FIG. 5 shows another example of an output circuit of FIG. 2, according to an embodiment of the invention.

DETAILED DESCRIPTION

Figure 1:
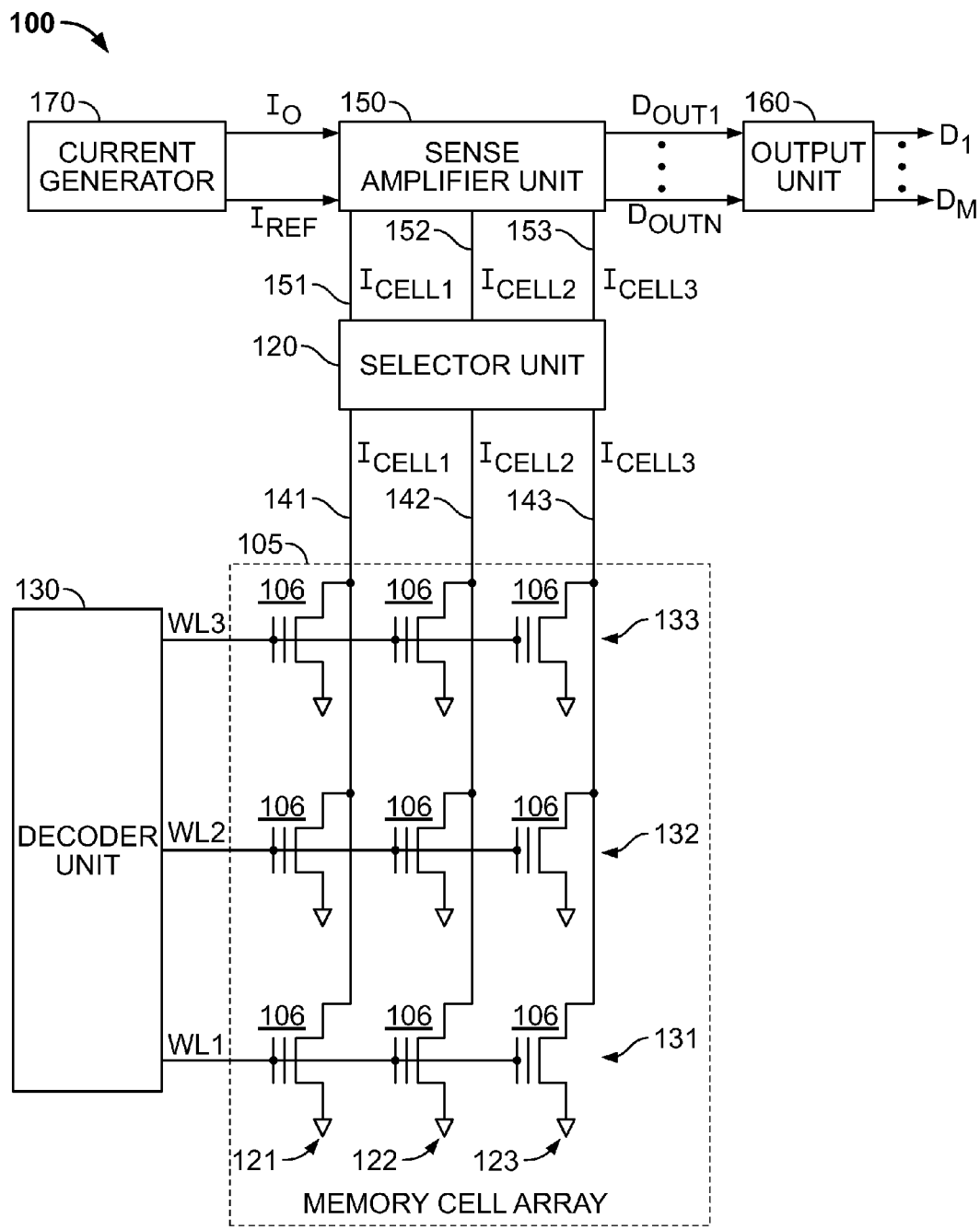
FIG. 1 shows a partial block diagram of a device according to an example embodiment of the invention.

FIG. 1 shows a partial block diagram of an example embodiment of a device 100. Device 100 can be a semiconductor device, such as a processor, a microcontroller, a memory device, or other devices.

Device 100 includes a memory cell array 105 with memory cells 106 arranged in rows 131, 132, and 133 and columns 121, 122, and 123. FIG. 1 shows an example arrangement of memory cells 106 to help focus on the embodiments described herein. Memory cells 106 can be arranged in other arrangements. For example, memory cells 106 can be arranged in a NAND flash memory cell configuration or in a NOR flash memory cell configuration. Moreover, FIG. 1 shows three rows and three columns with three memory cells 106 in each row and each column, as an example. The number of rows, columns, memory cells, and combinations thereof can vary. Further, FIG. 1 shows memory cells 106 as non-volatile memory cells, such as floating gate transistor memory cells. However, other type of memory cells can be used.

During a memory operation (e.g., a read operation) of device 100, a decoder unit 130 selectively activates signals WL1, WL2, and WL3 to access the memory cells in rows 131, 132, and 133, respectively. A selector unit 120 selectively couples lines 141, 142, 143 to lines 151, 152, and 153, respectively, depending on which of the memory cells 106 is selected. Lines 141, 142, 143, 151, 152, and 153 of device 100 can correspond to bit lines associated with memory cells of a memory device. Device 100 can select memory cell 106 based on information (e.g., address) provided to device 100 from another device, such as from a processor, a memory controller, or a microcontroller. For example, if device 100 selects to retrieve (e.g., read) information from memory cell 106 located at a junction (e.g., address) defined by row 132 and column 122, device 100 activates signal WL2 to access the selected memory cell 106. Then, selector unit 120 couples line 142 to line 152, so that the information from the selected memory cell can be retrieved.

The value of current $I_{CELL1}$ during a memory operation is based on a value of information stored in a selected memory cell 106 in column 121. The value of current $I_{CELL2}$ during a memory operation is based on a value of information stored in a selected memory cell 106 in column 122. The value of current $I_{CELL3}$ during a memory operation is based on a value of information stored in a selected memory cell 106 column 123.

Device 100 also includes a current generator 170 to provide various currents, such as $I_0$ and $I_{REF}$, for various operations of a sense amplifier unit 150. The functions of current $I_0$ and $I_{REF}$ are similar to those described below with reference to FIG. 2 through FIG. 7.

Sense amplifier unit 150 of FIG. 1 operates to sense signals (e.g., currents $I_{CELL1}$, $I_{CELL2}$, and $I_{CELL3}$) on lines 151, 152, and 153 to determine values of information stored in selected memory cells 106. For example, if one of memory cells 106 in column 122 is selected to provide information, then sense amplifier unit 150 senses current $I_{CELL2}$ on line 152 after line 152 is coupled to line 142 by selector unit 120. Based on the value of $I_{CELL2}$, sense amplifier unit 150 provides an output signal, which is one of output signals $D_{OUT1}$ through $D_{OUTN}$, that represents information stored in the selected memory cell 106. An output unit 160 of device 100 can further process signals $D_{OUT1}$ through $D_{OUTN}$ and provide them to other parts (e.g., output terminals or pins) of device 100 as signals $D_1$ through $D_M$. Sense amplifier unit 150 includes a sense amplifier unit described below with reference to FIG. 2 through FIG. 7.

Figure 2:
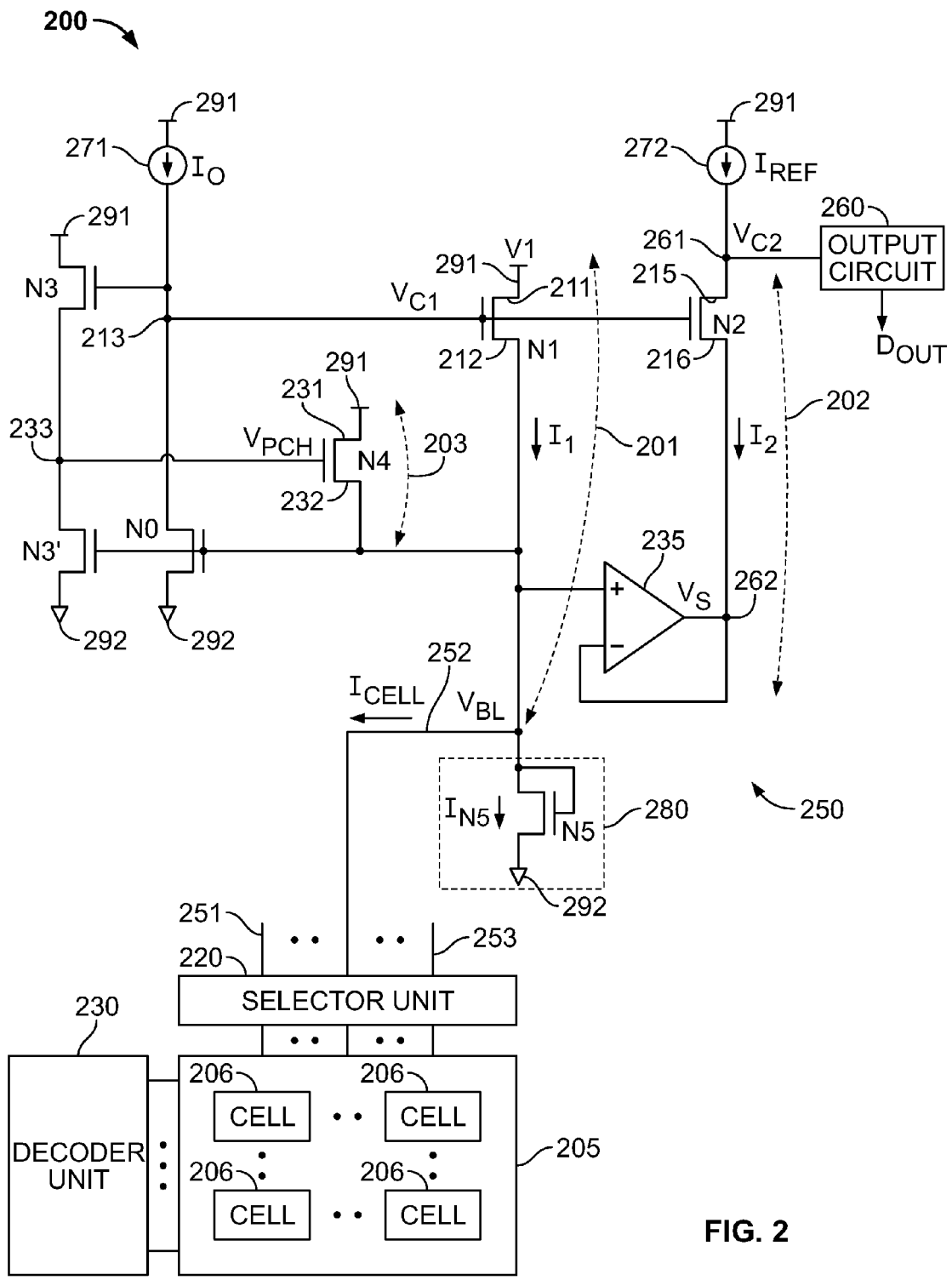
FIG. 2 shows a partial diagram of a device including a sense amplifier unit, according to an example embodiment of the invention.

FIG. 2 shows a partial diagram of an example embodiment of a device 200 including a sense amplifier unit 250. Device 200 includes a memory cell array 205 having memory cells 206, a selector unit 220, and a decoder unit 230; these components can correspond to memory cells 106, selector unit 120, and decoder unit 130 of FIG. 1.

Device 200 also includes lines 251, 252, and 253 to transfer information from memory cells 206. Lines 251, 252, and 253 can correspond to lines 151, 152, and 153, respectively, of FIG. 1. As shown in FIG. 2, line 252 is coupled to sense amplifier unit 250. Lines 251 and 253 are also coupled to other sense amplifier units similar to sense amplifier unit 250. However, for simplicity and to help focus on the embodiments herein, FIG. 2 omits the other sense other amplifier units coupled to lines 251 and 253.

As shown in FIG. 2, selector unit 220 is located between lines 251, 252, and 253 and memory cells 206. During a memory operation (e.g., read operation) of device 200, selector unit 220 operates to electrically couple one of lines 251, 252, or 253 to a selected memory cell 206. For example, selector unit 220 can turn on a transistor (not shown) located between a selected memory cell 206 and line 252, so that a current can flow between the selected memory cell 206 and line 252 through the turned-on transistor.

The value of current $I_{CELL}$ carried on line 252 during a memory operation is based on the value of information stored in a selected memory cell 206 coupled to line 252 during the memory operation. For example, if the information stored in a selected memory cell 206 has a first value (e.g., logic 0), then current $I_{CELL}$ can have a first value (e.g., some positive value); if the information stored in the selected memory cell 206 has a second value (e.g., logic 1), then current $I_{CELL}$ can have a second value (e.g., zero or approximately zero).

Sense amplifier unit 250 operates to sense current $I_{CELL}$ and generates an output signal $D_{OUT}$ that has a value based on the value of current $I_{CELL}$. The value of signal $D_{OUT}$ represents the value of information stored in a selected memory cell 206.

Sense amplifier unit 250 includes n-channel metal-oxide-semiconductor (NMOS) transistors N0, N1, N2, N3, N3', N4, and N5; an operational amplifier 235, an output circuit 260, and current sources 271 and 272; and a circuit 280 that includes transistor N5. Sense amplifier unit 250 also includes circuit paths 201, 202, and 203.

Circuit path 201 is coupled in series with a supply node 291 and line 252. During a memory operation, circuit path 201 carries a current $I_1$. $I_1 = I_{CELL} + I_{N5}$. $I_{N5}$ is a current flowing through transistor N5. The value of $I_{N5}$ may be zero or can be substantially small relative to current $I_{CELL}$. Therefore, current $I_{N5}$ can be neglected and current $I_1$ can be considered equal to or approximately equal to current $I_{CELL}$. As described above, since sense amplifier unit 250 generate an output signal $D_{OUT}$ based on current $I_{CELL}$ and since $I_1 = I_{CELL}$ (neglecting $I_{N5}$), sensing current $I_{CELL}$ to generate output signal $D_{OUT}$ is equivalent to sensing current $I_1$ output signal $D_{OUT}$.

As shown in FIG. 2, circuit path 201 includes only one transistor N1 located between supply node 291 and selector unit 220. Transistor N1 includes a node 211 (e.g., drain) directly coupled to supply node 291, a node 212 (e.g., source) directly coupled to line 252, and a gate responsive to a voltage $V_{C1}$ at a circuit node 213. In the description herein, "directly coupled" means a direct connection between two circuit elements without going though a third circuit element, such as through a transistor, a capacitor, or a resistor.

Voltage V1 can be a supply voltage (e.g., VDD or VCC) that device 200 uses to operate. Voltage V1 can have a range from approximately 1 volt to approximately 3.6 volts. Other ranges can be used.

Circuit path 202 is coupled between nodes 261 and 262. As shown in FIG. 2, circuit path 202 includes only one transistor N2 located therein. Transistor N2 includes a node 215 (e.g., drain) directly coupled to circuit node 261, a node 216 (e.g., source) directly coupled to circuit node 262, and a gate coupled to the gate of transistor N1 at circuit node 213. Transistor N2, operational amplifier 235, and transistor N1 are arranged in a configuration as shown in FIG. 2 to copy current $I_1$ from circuit path 201 to generate a current $I_2$ on circuit path 202. Transistors N1 and N2 and operational amplifier 235 can be configured such that $I_2 = I_1$. For example, the size of transistors N1 and N2 can be the same and operational amplifier 235 can be configured to operate as a unity gain operational amplifier, such that a non-inverting input (+) is coupled to line 252 and an inverting input (−) is coupled to the same circuit node 262 as an output node of operational amplifier 235. Node 262 has a voltage $V_S$.

Current source 272 provides a current $I_{REF}$ (reference current) to circuit path 202. Output circuit 260 generates output signal $D_{OUT}$ based on a voltage $V_{C2}$ at circuit node 261. The value of voltage $V_{C2}$ is based on a comparison between current $I_{REF}$ and current $I_2$. Output circuit 260 generates output signal $D_{OUT}$ with a first value (e.g., logic 0) when $I_2$ is greater than $I_{REF}$ and with a second value (e.g., logic 1) when $I_2$ is less than $I_{REF}$.

Circuit path 203 is coupled between supply node 291 and line 252. As shown in FIG. 2, circuit path 203 includes only one transistor N4 located therein. During a memory operation, in addition to charging line 252 to a voltage via circuit path 201, sense amplifier unit 250 also charges line 252 to the voltage via circuit path 203, before sense amplifier unit 250 senses current $I_{CELL}$ to generate output signal $D_{OUT}$.

Transistor N4 includes a node 231 (e.g., drain) directly coupled to supply node 291, a node 232 (e.g., source) directly coupled to line 252, and a gate responsive to a voltage coupled to a circuit node 233 to receive a voltage $V_{PCH}$. Transistors N3 and N3' are coupled in series between supply node 291 and a supply node 292 and can operate to control voltage $V_{PCH}$ at the gate of transistor N4. Supply node 292 can have a voltage of zero volts or a ground potential.

Current source 271 generates a current $I_0$ and operates in combination with transistor N0 to bias transistors N1 and N2 during a memory operation. Transistor N0 is also coupled to transistor N1 to form a current-to-current feedback loop to maintain a stable voltage on line 252 uncorrelated to current $I_{CELL}$. To improve operations of sense amplifier unit 250, current source 271 can include components to generate current $I_0$, such that current $I_0$ is insensitive to supply voltage (e.g., V1) variation. For example, current source 271 can include a current generator that can generate a proportional to absolute temperature (PTAT) current or complementary to absolute temperature (CTAT) current. Current $I_0$ can be generated based on the PTAT or CTAT current, so that it can be insensitive to supply voltage (e.g., V1) variation.

Circuit 280 creates a path from line 252 to supply node 292 to discharge unexpected overshoot (e.g., positive glitch) on line 252. FIG. 1 shows circuit 280 having a single transistor N5 to create a path from line 252 to supply node 292, as an example. Other circuit elements and arrangements can be used to discharge unexpected overshoot on line 252.

A memory operation of device 200 to generate output signal $D_{OUT}$ to represent a value of a select memory cell 206 can include a precharge function, a sensing function, and an output function. Sense amplifier unit 250 performs the precharge function during a first time interval of a memory operation to charge line 252, such that the value of voltage $V_{BL}$ can reach an expected (e.g., clamped) value. Sense amplifier unit 250 performs the sensing function during a second time interval after the first time interval of a memory operation to generate current $I_1$ on circuit path 201 based on current $I_{CELL}$. Sense amplifier unit 250 performs the output function after the sensing operation to generate output signal $D_{OUT}$ based on current $I_1$.

In a precharge function, sense amplifier unit 250 charges (or precharges) line 252 and maintains a stable voltage on line 252. Voltage $V_{BL}$ is the voltage on line 252. To limit cycling degradation of memory cells 206 in memory operations, such as read operations, sense amplifier unit 250 can charge line 252 during the precharge operation, such that voltage $V_{BL}$ has an expected value less than a value of voltage V1 at supply node 291. The expected value can be approximately at least equal to one-half of the value of voltage V1 during the precharge operation. For example, voltage $V_{BL}$ can have a value of approximately 0.7 volt when the value of voltage V1 is in the range from approximately 1 volt to approximately 1.4 volts. The value of voltage V1 can be in a range from approximately 1 volt to approximately 3.6 volts.

As described above, transistors N0 and N1 form a current-current feedback loop. During a memory operation, the current-current feedback loop can maintain a stable voltage on line 252 uncorrelated to current $I_{CELL}$. At the beginning of a precharge operation, voltage $V_{BL}$ on line 252 can be approximately zero. Current $I_0$ flows through transistor N0. Voltage $V_{C1}$ increases and turns on transistor N1. Line 252 is electrically coupled node to 291 through transistor N1. Current $I_1$ flows on circuit path 201 through transistor N1. Thus, line 252 is charged to supply node 291 through transistor N1 of circuit path 201. However, at the beginning of the memory operation, current $I_1$ may be insufficient to quickly charge line 252 to an expected value (e.g., 0.7 volt) within a specified time. The specified time includes a time interval where voltage $V_{BL}$ on line 252 is expected to reach an expected value before a selected memory cell 206 is electrically coupled to line 252 for a sensing function.

Transistors N3, N3', and N4 form a circuit to quickly charge line 252 to expected value during a precharge function to improve the precharge function, such as to increase the precharge speed. In the precharge function, voltage $V_{PCH}$ increases and turns on transistor N1. Line 252 is electrically coupled to supply node 291 through transistor N4. Thus, during the precharge function, line 252 is electrically coupled to supply node 291 through transistor N1 of circuit path 301 and through transistor N4 of circuit path 203. Transistor N4 can be configured such that it can drive enough current to set the value of voltage $V_{BL}$ on line 252 to an expected voltage (e.g., 0.7 volt) within the specified time.

The size of transistor N0 and the value of current $I_0$ determine a value (e.g., 0.7 volt) at which voltage $V_{BL}$ is maintained (e.g., clamped) during the precharge function. When the value of voltage $V_{BL}$ on line 252 reaches the trip point of an inverting amplifier formed by transistor N0 and current $I_0$, transistors N3 and N3' (which serve as a source follower stage) creates an offset voltage between $V_{C1}$ and $V_{PCH}$. The offset voltage is equal to the gate to source voltage ($V_{GS\_N3}$) of transistor N3. As a result, transistor N4 is turned off. Thus, almost all of the current between supply node 291 and line 252 flows through transistor N1. A current $I_{N5}$ may also flow through transistor N5. However, as described above, the value of $I_{N5}$ may be zero or can be substantially small. Therefore, current $I_1$ can be considered equal to or approximately equal to current $I_{CELL}$.

Transistors N1, N3 and N4 can have the same size. The threshold voltage of transistors N1, N3 and N4 can be greater than zero volts (for example, approximately 0.5 to 0.7 volt). However, the threshold voltage of transistors N1, N3 and N4 can be zero volts to improve the range of voltage V1 and the offset voltage mentioned above. Transistor N3' can have the same size as that of transistor N0, so that transistor N3' can fix the current in the stage at current $I_0$.

In a sensing function, which is after the precharge function described above, current $I_{CELL}$ associated with a selected memory cell 206 flows on line 252 after the selected memory cell 206 is accessed and coupled to line 252. Transistor N1 remains turned on by voltage $V_{C1}$. The value of current $I_1$ flowing through the transistor N1 is approximately equal to the value of current $I_{CELL}$ on line 252, attributed to a current-current feedback loop formed by transistors N0 and N1 and to the value of voltage $V_{BL}$ maintained by current $I_0$.

Sense amplifier unit 250 copies current $I_1$ and generates current $I_2$ on circuit path 202. Since transistors N1 and N2 have the same size and are coupled to operational amplifier 235 in a configuration shown in FIG. 2, the gate to source voltage ($V_{GS\_N1}$) of transistors N1 is equal to the gate to source voltage ($V_{GS\_N2}$) of transistors N2. Thus, the value of current $I_2$ can be equal to the value of current $I_1$ and the value of voltage $V_S$ is approximately equal to the value of voltage $V_{BL}$. The current trip point of sense amplifier unit 250 occurs when current $I_2$ flowing through N2 is equal to current $I_{REF}$. This current trip point can be adjusted by adjusting the value of current $I_{REF}$.

In an output function, output circuit 260 generates output signal $D_{OUT}$ based on the current trip point, which in turn is based on a comparison between the values of current $I_2$ and $I_{REF}$. For example, output circuit 260 generates output signal $D_{OUT}$ with a first value (e.g., logic 0) when $I_2$ is greater than $I_{REF}$ and with a second value (e.g., logic 1) when $I_2$ is less than $I_{REF}$.

Sense amplifier unit 250 includes a relatively fewer components (e.g., fewer transistors) than some conventional sense amplifier circuits. Therefore, sense amplifier unit 250 can operate at a relatively lower supply voltage (e.g., voltage V1). Further, in some conventional devices, lines (e.g., bit lines) coupled to sense amplifier circuits may be disturbed by the device supply voltage variation, especially at a higher supply voltage. Therefore, some conventional devices may be limited to a lower supply voltage. In sense amplifier unit 250 of FIG. 2, voltage $V_{BL}$ on line 252 is controlled in part by current $I_0$. Since current $I_0$ current is generated by current source 271, which is insensitive to supply voltage variation, voltage $V_{BL}$ is also insensitive to supply voltage variation. Therefore, sense amplifier unit 250 can operate at a relatively higher supply voltage with a reduced disturbance to voltage $V_{BL}$ caused by supply voltage variation.

The above description describes sense amplifier unit 250 generating a singled-ended output signal ($D_{OUT}$). However, sense amplifier unit 250 can also be used as a part of a differential circuit to generate differential signals.

The above functions of sense amplifier unit 250 are influenced by the values voltages $V_{BL}$ and $V_{PCH}$ and the current trip point. The following description describes a DC modeling for voltages $V_{BL}$ and $V_{PCH}$ calculation and for the current trip point calculation.

A first order modeling for voltages $V_{BL}$, and $V_{PCH}$ calculation is as follows. The large signal DC voltage $V_{BL}$, of line 252 is determined by the gate to source voltage ($V_{GS\_N0}$) of transistor N0:

$$V_{BL} \approx V_{GS\_N0} = V_{TH\_N0} + \sqrt{\frac{2 \times I_0}{\beta_{N0}}}$$

$V_{TH\_N0}$ and $\beta_{N0}$ are, respectively, the threshold voltage and the transconductance factor of transistor N0. Current $I_0$ is from current source 272 that flows through the drain of N0 at circuit node 213. Current $I_0$ can be generated such that it is substantially insensitive to supply voltage (e.g., V1) variation, so that voltage $V_{BL}$ can be substantially insensitive to supply voltage variation, thereby improving the operations of sense amplifier unit 250. The impedance of line 252 is relatively low due to the current-current feedback loop formed by transistors N0 and N1. Thus, current $I_{CELL}$ on line 252 can have a fewer variations relative to voltage $V_{BL}$, leading to more accuracy in sensing operation.

Transistors N0 and N1 can be configured to operate in saturation region. The inverting amplifier (formed by transistor N0 and current $I_0$) has a high gain $A_{INV0}$ defined as follows.

$$A_{INV0} \approx gm_{N0} \times rds_{N0}$$

In the above expression, $gm_{N0}$ and $rds_{N0}$ are, respectively, the transconductance and output resistance of transistor N0. The high gain of the inverting amplifier $A_{INV0}$ determines the small signal line voltage variation $\Delta V_{BL}$ depending on the small signal cell current $\Delta I_{CELL}$:

$$\Delta V_{BL} \approx \frac{1}{-A_{INV0} \cdot gm_{N1}} \Delta I_{CELL}$$

In the above expression, $gm_{N1}$ is the transconductance of transistor N1.

At the end of the precharge function of sense amplifier unit 250, transistor N4 can be turned off, so that it does not derive current from transistor N1 during the sensing function, occurring after the precharge function. As shown in FIG. 2, transistor N4 can be turned on or off by controlling the value of voltage $V_{PCH}$, which also depends in part on the value of voltage $V_{C1}$. A voltage shift $V_{SHIFT}$ between $V_{C1}$ and $V_{PCH}$ can be controlled based on the following equation.

$$V_{SHIFT} = V_{GS\_N3} = V_{C1} - V_{PCH}$$

In the above equation, $V_{GS\_N3}$ is the gate to source voltage of transistor N3. $V_{GS\_N3}$ depends on the sizing of transistors N3 and N3' and on voltage $V_{BL}$ on line 252. Voltage shift $V_{SHIFT}$ can be rewritten as follows.

$$V_{SHIFT} = V_{GS3} = V_{TH\_N3} + \sqrt{\frac{\beta_{N3'}}{\beta_{N3}}} (V_{BL} - V_{TH\_N3'})$$

In the above equation, $\beta_{N3}$ and $\beta_{N3'}$ are the transconductance factors of transistors N3 and N3', respectively. As previously mentioned, voltage $V_{BL}$ can be substantially insensitive to supply voltage variation. Therefore, voltage shift $V_{SHIFT}$ can be substantially insensitive to supply voltage variation.

Voltage $V_{C1}$ depends on current $I_{CELL}$. Thus, voltage $V_{PCH}$ can be varied accordingly so as to keep $V_{SHIFT}$ constant with $I_{CELL}$ current variation.

$$\Delta V_{C1} \approx -A_{INV0} \times \Delta V_{BL} \approx \frac{1}{gm_{N1} + gmb_{N1}} \Delta I_{CELL}$$

$$\Delta V_{PCH} = \frac{gm_{N3}}{gm_{N3} + gmb_{N3}} \Delta V_{C1}$$

In the above equation, $gm_{N3}$ is the transconductance transistor N3 and $gmb_{N3}$ is the bulk (or body effect) transconductance transistor N3. The value of $gmb_{N3}$ can be relatively small in comparison the value of $gm_{N3}$. Thus, $gmb_{N3}$ can be neglected from the above equation. Therefore, the above equation can be rewritten as follows.

$$\Delta V_{PCH} \approx \Delta V_{C1}$$

A first order modeling for the current trip point calculation is as follows. The sense amplifier output $D_{OUT}$ switches from one value (e.g., logic 0) to another value (e.g., logic 1) when voltage $V_{C2}$ reaches the trip point of output circuit 260. Voltage $V_S$ is equal to voltage $V_{BL}$ attributed to operational amplifier 235 coupled in a follower configuration. The source voltage $V_{S\_N2}$ of transistor N2 coupled to circuit node 262 is equal to the source voltage $V_{S\_N1}$ of transistor N1 coupled to line 252:

$$V_{S\_N2} = V_S = V_{S\_N2} = V_{BL}$$

The gate voltage $V_{G\_N2}$ of transistor N2 is also equal to the gate voltage $V_{G\_N1}$ of transistor N1:

$$V_{G\_N2} = V_{G\_N1} = V_{C1}$$

Thus, the gate to source voltage $V_{GS\_N2}$ of transistor N2 is equal to the gate to source voltage $V_{GS\_N1}$ transistor N1:

$$V_{GS\_N2} = V_{GS\_N1} = V_{C1} - V_{BL}$$

Transistors N2 and N1 can be configured such that they are closely matched (e.g., having the same size). At trip point, a current $I_{D\_N2}$ flowing through transistor N2 is equal to a current $I_{D\_N1}$ flowing through transistor N1 because their gate to source voltages are equal ($V_{G\_N1} = V_{D\_N1}$):

$$I_{D\_N2} = I_{D\_N1} = I_{CELL\_TRIPPOINT} + I_{D\_N5} = I_{REF}$$

The value of $I_{D\_N5}$ can be relatively small in comparison with the value of $I_{REF}$. Thus, $I_{D\_N1}$ can be neglected from the above equation. Therefore, the above equation can be rewritten as follows.

$$I_{CELL\_TRIPPOINT} \approx I_{REF}$$

At trip point, transistor N2 operates in saturation region. Neglecting the follower mode output resistance of operational amplifier 235 compared to the output resistance $rds_{N2}$ of transistor N2, a small signal gain of $V_{C2}$ at trip point can be written as follows.

$$\Delta V_{C2} \approx gm_{N2} \times rds_{N2} \times \Delta V_{C1} \approx \frac{gm_{N2} \times rds_{N2}}{gm_{N1} + gmb_{N1}} \Delta I_{CELL}$$

In the above equation, $gmb_{N1}$ is the bulk transconductance transistor N1, and $gm_{N2}$ is the transconductance transistor N2. As mentioned above, transistors N1 and N2 are closely matched with equaled gate to source voltage. Thus, $gm_{N1} = gm_{N2}$. When $gmb_{N1}$ is neglected, the above equation can be rewritten as follows.

$$\Delta V_{C2} \approx rds_{N2} \times \Delta I_{CELL}$$

Thus, voltage $V_{C2}$ widely varies around trip point where $I_{CELL\_TRIPPOINT}$ is equal to $I_{REF}$. A small variation $\Delta I_{CELL}$ around the trip point is widely amplified by $rds_{N2}$ so as to produce a large variation $\Delta V_{C2}$ of voltage $V_{C2}$ with different values. Based on these values of voltage $V_{C2}$, output circuit 260 can generate output signal $D_{OUT}$ with values (e.g., logic 0 or logic 1) corresponding to the value of a voltage $V_{C2}$. For example, if $I_{CELL}$ is greater than $I_{REF}$, voltage $V_{C2}$ can substantially decrease so as to widely open current $I_{REF}$ from current source 272, down to $V_{C2} \approx V_S$; and output signal $D_{OUT}$ has a second value (e.g., logic 0). If $I_{CELL}$ is less than $I_{REF}$, voltage $V_{C2}$ can substantially increase so as to turn off current $I_{REF}$ from current source 272, up to $V_{C2} \approx V_1$ (e.g., supply voltage); and output signal $D_{OUT}$ has a first value (e.g., logic 1).

FIG. 3 shows an example embodiment of operational amplifier 235 of FIG. 2. As shown in FIG. 3, operational amplifier 235 includes NMOS transistors N6, N7, and N8; a current source 373 to provide a current $I_3$; and p-channel metal-oxide-semiconductor (PMOS) transistors P1 and P2.

The value of current $I_3$ can be the same as or different from the value of current $I_0$ of FIG. 2. Voltages V1, $V_{BL}$, and $V_S$ are the same as those in FIG. 2.

Transistors N6 and N7 can be configured to match (e.g., having a same size as) transistor N0 of FIG. 2, so that a current flowing through each of transistors N6 and N7 can be the same as current $I_0$ flowing through transistor N0. This in turn allows current $I_2$ to be a copy of current $I_1$ during the sensing function described above with reference to FIG. 2.

FIG. 4 shows an example embodiment of output circuit 260 of FIG. 2. As shown in FIG. 4, output circuit 260 includes a transistor N9, inverters 411 and 412, and a current source 474, which provides a current $I_4$. Voltages V1 and $V_{C2}$ and output signal $D_{OUT}$ are the same as those in FIG. 2. As described above with reference to FIG. 2, output circuit 260 in FIG. 3 generates output signal $D_{OUT}$ with a first value (e.g., logic 0) when $I_2$ (which corresponds to $I_{CELL}$) is greater than $I_{REF}$ and with a second value (e.g., logic 1) when $I_2$ is less than $I_{REF}$. In FIG. 3, when $I_2$ (FIG. 2) is greater than $I_{REF}$, voltage $V_{C2}$ decreases and turns off transistor N9. The voltage at node 401 of FIG. 4 also decreases. Inverters 411 and 412 operate to provide output signal $D_{OUT}$ with a value corresponding to logic 0. When $I_2$ (FIG. 2) is less than $I_{REF}$, voltage $V_{C2}$ increases and turns on transistor N9. The voltage at node 401 also increases. Inverters 411 and 412 operate to provide output signal $D_{OUT}$ with a value corresponding to logic 1.

FIG. 5 shows another example embodiment of output circuit 260 of FIG. 2. As shown in FIG. 5, output circuit 260 includes transistors P3, N10, and N11, and an inverter 513. Voltages V1 and $V_{C2}$ and output signal $D_{OUT}$ are the same as those in FIG. 2. As described above with reference to FIG. 2, output circuit 260 generates output signal $D_{OUT}$ with a first value (e.g., logic 0) when $I_2$ (which corresponds to $I_{CELL}$) is greater than $I_{REF}$ and with a second value (e.g., logic 1) when $I_2$ is less than $I_{REF}$. In FIG. 3, when $I_2$ (FIG. 2) is greater than $I_{REF}$, voltage $V_{C2}$ decreases and turns on transistor P3 and turns off transistor N10. The voltage at node 501 of FIG. 5 increases. Inverter 513 operates to provide output signal $D_{OUT}$ with a value corresponding to logic 0. When $I_2$ (FIG. 2) is less than $I_{REF}$, voltage $V_{C2}$ increases and turns on transistor N10 and turns off transistor P3. The voltage at node 501 also decreases. Inverter 513 operates to provide output signal $D_{OUT}$ with a value corresponding to logic 1.

Figure 6:
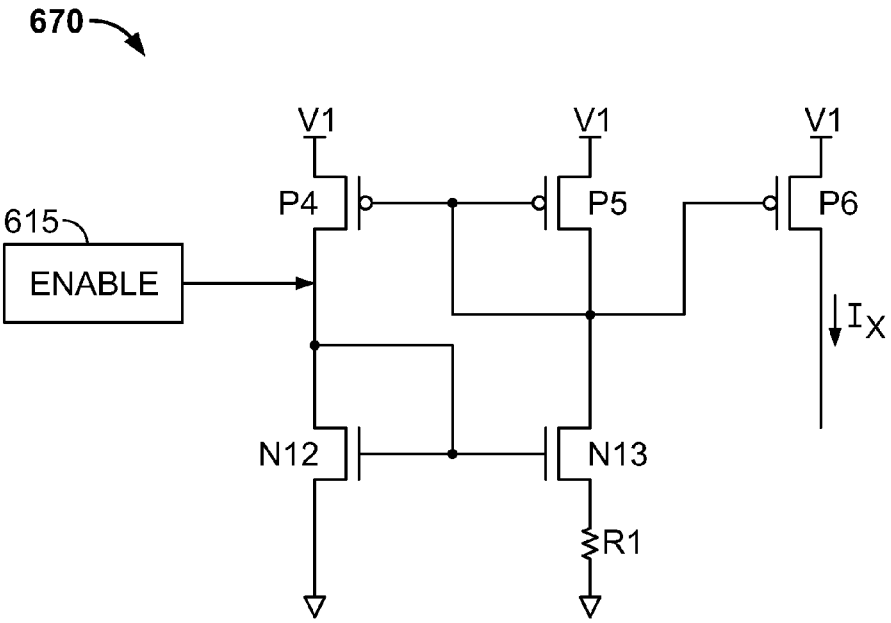
FIG. 6 shows a current generator, according to an example embodiment of the invention.

FIG. 6 shows an example embodiment a current generator 670. Current generator 670 generates a current $I_X$ and can be used to generate current $I_0$ and $I_{REF}$ of FIG. 1 and FIG. 2, current $I_3$ of FIG. 3, and current $I_4$ of FIG. 4. For example, each of current sources 271 and 272 of FIG. 2, current source 373 of FIG. 3, and current source 474 of FIG. 4 can include current generator 670. Thus, current generator 670 can be configured to generate current $I_X$ with different values corresponding to the different values of current $I_0$ and $I_{REF}$ of FIG. 1, current $I_3$ of FIG. 3, and current $I_4$ of FIG. 4. For example, transistor P6, resistor R1, or both, of current generator 670, can have different sizes to provide current $I_X$ with different values. As shown in FIG. 6, current generator 670 includes transistors P4, P5, P6, N12, and N13, and a resistor R1. Current generator 670 can also include enable circuit 615 to start current generator 670 to generate current $I_X$. For example, when used in device 200 of FIG. 2, enable circuit 615 may start current generator 670 in a memory operation of device 200, such as at the beginning of a precharge function of sense amplifier unit 250 of FIG. 2.

In FIG. 6, the characteristics of current generator 670 can be similar to a current generator that can generate a proportional to absolute temperature (PTAT) current, such that current $I_X$ can be insensitive to supply voltage (e.g., V1) variation. Since current $I_0$ in FIG. 1 can be generated from current generator 670, current $I_0$ can also be insensitive to supply voltage variation, thereby improving the operations of sense amplifier unit 250, as described above with reference to FIG. 2.

Figure 7:
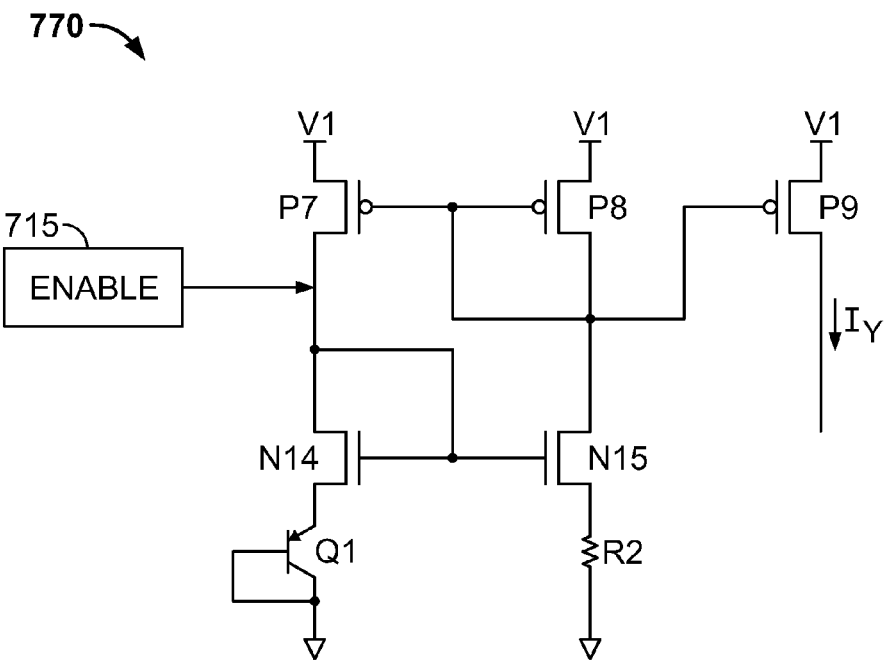
FIG. 7 shows another current generator, according to an example embodiment of the invention.
Figure 1:
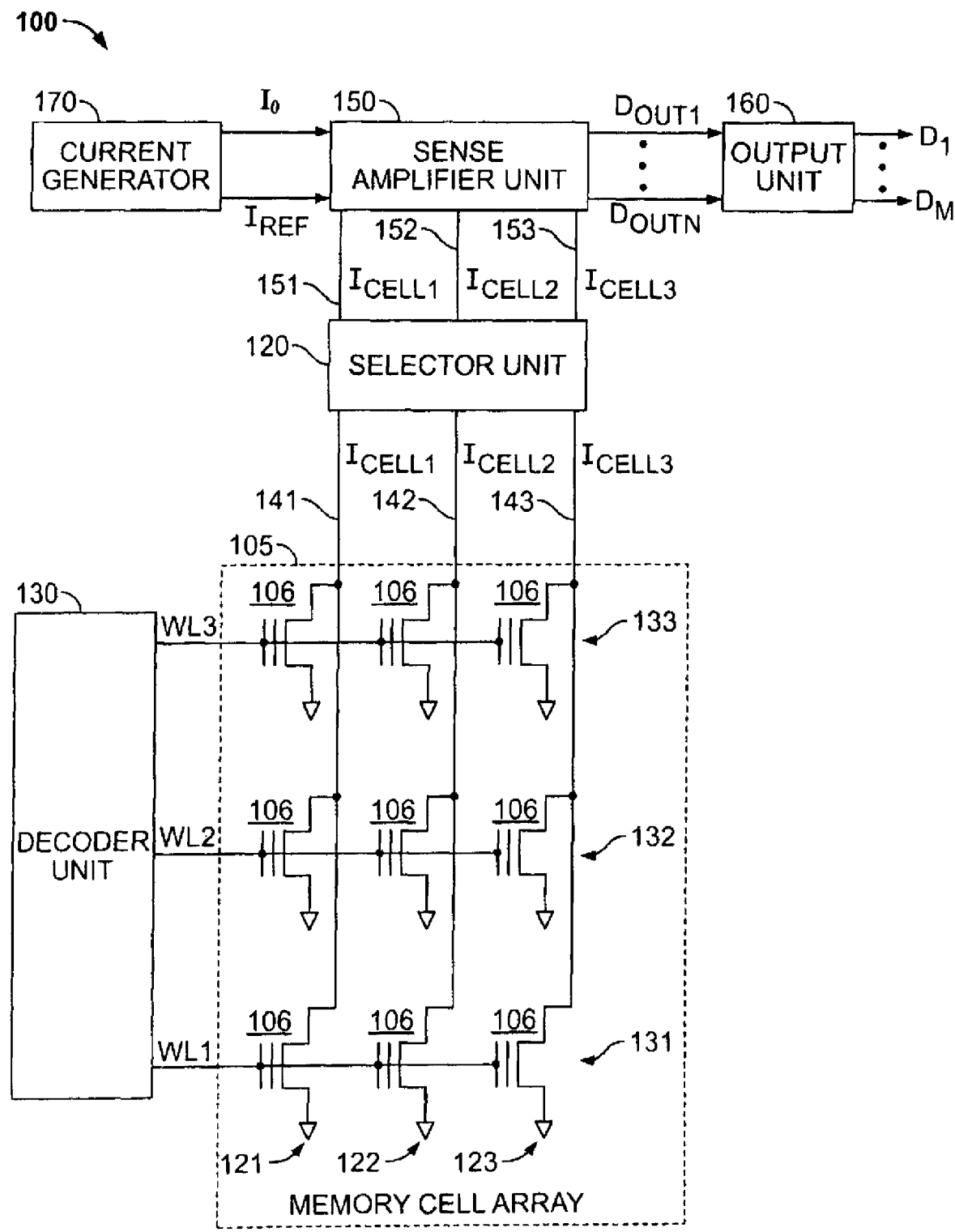
Figure 2:
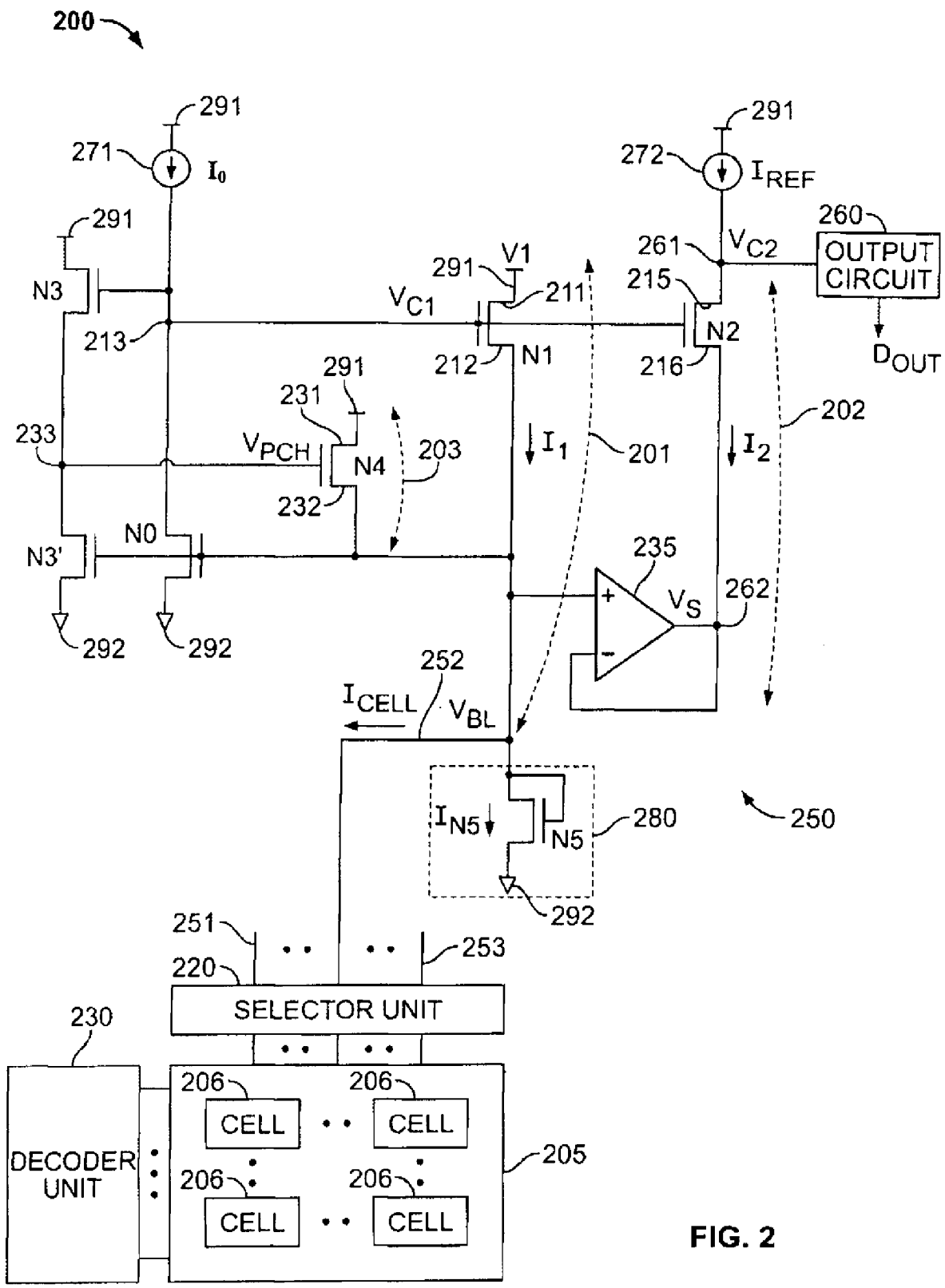

FIG. 7 shows an example embodiment of a current generator 770. Current generator 770 generates a current $I_Y$ and can be used to generate current $I_0$ and $I_{REF}$ of FIG. 1 and FIG. 2, current $I_3$ of FIG. 3, and current $I_4$ of FIG. 4. For example, each of current sources 271 and 272 of FIG. 2, current source 373 of FIG. 3, and current source 474 of FIG. 4 can include current generator 770. Thus, current generator 770 can be configured to generate current $I_Y$ with different values corresponding to the different values of current $I_0$ and $I_{REF}$ of FIG. 1, current $I_3$ of FIG. 3, and current $I_4$ of FIG. 4. For example, transistor P9, resistor R2, or both, of current generator 770, can have different sizes to provide current $I_Y$ with different values. As shown in FIG. 7, current generator 770 includes transistors P7, P8, P9, N14, and N15, a bipolar junction (BJT) transistor Q1, and a resistor R2. Current generator 770 can also include enable circuit 715 to start current generator 770 to generate current $I_Y$. For example, when used in device 200 of FIG. 2, enable circuit 715 may start current generator 770 in a memory operation of device 200, such as at the beginning of a precharge function of sense amplifier unit 250 of FIG. 2.

In FIG. 7, the characteristics of current generator 770 can be similar to a current generator that can generate a complementary to absolute temperature (CTAT) current, such that current $I_Y$ can be insensitive to supply voltage (e.g., V1) variation. Since current $I_0$ in FIG. 1 can be generated from current generator 770, current $I_0$ can also be insensitive to supply voltage variation to improve operations of sense amplifier unit 250, as described above with reference to FIG. 2.

One or more embodiments described herein include apparatus and methods having a sense amplifier unit, a supply node to receive a supply voltage, and a line coupled to a memory cell of a device. The sense amplifier unit includes a circuit path coupled between the supply node and the line to carry a current having a value based on a value of information stored in the memory cell. The circuit path includes only one transistor located between the supply node and the line. Other embodiments, including additional apparatus and methods, are described above with reference to FIG. 1 through FIG. 7.

The illustrations of the apparatus, such as devices 100 and 200 and their associated components, are intended to provide a general understanding of the structure of various embodiments and not a complete description of all the elements and features of the apparatus that might make use of the structures described herein.

Any of the components described above can be implemented in a number of ways, including simulation via software. Thus, the apparatus (e.g., devices 100 and 200) and their associated components described above can all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., devices 100 and 200), and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatus of various embodiments includes or can be included in electronic circuitry used in high-speed computers, communication and signal processing circuitry, memory modules, portable memory storage devices (e.g., thumb drives), single or multi-processor modules, single or multiple embedded processors, multi-core processors, data switches, and application-specific modules including multilayer and multi-chip modules. Such apparatus may further be included as sub-components within a variety of electronic systems such as televisions, memory cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Portions and features of some embodiments may be included in, or substituted for, those of others. Other embodiments will be apparent to those of skill in the art upon reading and understanding the above description.

The Abstract is provided to comply with 37 C.F.R. §1.72(b) and is submitted with the understanding that it will not be used to interpret or limit the scope or meaning of the claims.

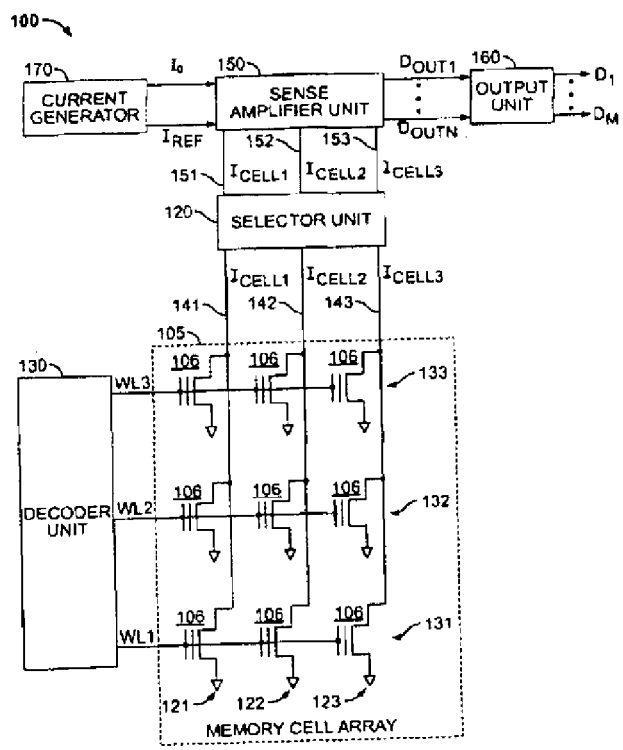

What is claimed is:

1. An apparatus comprising:
    a supply node to receive a supply voltage;
    a line coupled to a memory cell of a device; and
    a sense amplifier unit configured to compare a copy of a current with a reference current to generate an output signal, wherein the copy of the current has an amplitude based on a value of information stored in the memory cell, and wherein the output signal represents the value of information stored in the memory cell, the sense amplifier including:
        a circuit path coupled between the supply node and the line to carry the current, the circuit path including a first transistor located between the supply node and the line;
        a second transistor including a second gate coupled to a first gate of the first transistor, the second transistor including a first transistor node coupled to a circuit node; and
        an operational amplifier including a first input node coupled to the line, a second input node coupled to the circuit node, and an output node coupled to the circuit node.

2. The apparatus of claim 1, wherein the sense amplifier is configured to electrically couple the line to the supply node through the circuit path and to electrically couple the line to the supply node through an additional circuit path.

3. The apparatus of claim 1, further comprising a discharge transistor including a gate coupled to the line, a first node coupled to the line, and a second node coupled to a second supply node.

4. The apparatus of claim 3, wherein the second supply node is a ground node.

5. The apparatus of claim 1, further comprising a current source coupled to a second transistor node on the second transistor, wherein the current source is configured to provide the reference current.

6. The apparatus of claim 1, further comprising:
    a first circuit to charge the line to a voltage during a first time interval of a memory operation;
    a second circuit coupled to the line, the second circuit including the operational amplifier, wherein the second circuit is configured to generate the output signal based on the value of information stored in the memory cell during a second time interval of the memory operation.

7. A system comprising:
    a matrix of memory cells;
    a column selector unit coupled to the matrix of memory cells;
    a row decoder unit coupled to the matrix of memory cells;
    a supply node to receive a supply voltage;
    a line, wherein the line is coupled to the supply node through a first transistor, and wherein the line is coupled to a memory cell in the matrix of memory cells through the column selector unit;
    a first circuit to charge the line to a voltage during a first time interval of a memory operation;
    a second circuit including a circuit path coupled to the line to carry a current having an amplitude based on a value of information stored in the memory cell during a second time interval of the memory operation, the second circuit configured to generate an output signal based on the amplitude of the current.

8. The system of claim 7, wherein the voltage has a value at least equal to one half of a value of the supply voltage during the first time interval of a memory operation of a device.

9. The system of claim 7, wherein the first transistor includes a first node directly coupled to the supply node, a second node directly coupled to the line, and a gate to receive a turn-on voltage to turn on the transistor during the first time interval and during the second time interval.

10. The system of claim 9, wherein the first circuit includes a second transistor including a first node directly coupled to the supply node, a second node directly coupled to the line, and a gate to receive an additional voltage to turn on the second transistor during the first time interval and to turn off the second transistor during the second time interval.

11. The system of claim 7, wherein the second circuit is configured to generate an additional current based on the current on the circuit path and to compare the additional current with a reference current to generate the output signal.

12. The system of claim 11, wherein the second circuit is configured to generate the output signal with a first value when a value of the additional current is greater than a value of the reference current, and the second circuit is configured to generate the output signal with a second value when the value of the additional current is less than the value of the reference current.

13. An apparatus comprising:
    a supply node;
    a line coupled to a memory cell;
    a first transistor coupled between the supply node and the line;
    a second transistor including a gate coupled to a gate of the first transistor, a first node coupled to a first circuit node, and a second node coupled to a second circuit node;
    an operational amplifier including a first input coupled to the line, a second input coupled to the second circuit node, and an output coupled to the second circuit node;

a third transistor including a gate coupled to the line, a first node coupled to a gate of the first transistor, and a second node coupled to a second supply node;

a current source coupled to the first node of the third transistor; and a fourth transistor coupled between the first supply node and the line and including a gate coupled to a third circuit node;

wherein the second supply node is a ground node.

14. The apparatus of claim 13 further comprising a fifth transistor and a sixth transistor coupled in series between the first and second supply nodes, and a node between the fifth and sixth transistors coupled to the third circuit node.

15. The apparatus of claim 13 further comprising an additional current source coupled to the first circuit node.

16. The apparatus of claim 15 further comprising an output circuit responsive to a voltage value at the first circuit node to provide an output signal representing a value of information stored in the memory cell.

17. The apparatus of claim 13, wherein the first and second transistors have a same size.

* * * * *

UNITED STATES PATENT AND TRADEMARK OFFICE
CERTIFICATE OF CORRECTION

| | | |
|---|---|---|
| PATENT NO. | : 8,588,021 B2 | |
| APPLICATION NO. | : 13/584265 | |
| DATED | : November 19, 2013 | |
| INVENTOR(S) | : Jimmy Fort et al. | |

It is certified that error appears in the above-identified patent and that said Letters Patent is hereby corrected as shown below:

On the Title Page

Delete title page and substitute the attached title page therefor.

Item (75), Col. 1 (Inventors), Line 2, delete "Marseilles (FR);" and insert --Marseille (FR);--, therefor.

In the Drawings

Delete drawing sheets 1 and 2, substitute the attached drawing sheets 1 and 2 therefor.

On Sheet 1 of 4 (Fig. 1), Line 2, delete "$I_O$" and insert --$I_0$--, therefor.

On Sheet 2 of 4 (Fig. 2), Line 4, delete "$I_O$" and insert --$I_0$--, therefor.

In the Specification

In Column 3 Line 47, delete "though" and insert --through--, therefor.

In Column 6 Line 46, delete "$V_{BL}$," and insert --$V_{BL}$--, therefor.

In Column 6 Line 47, delete "$V_{BL}$," and insert --$V_{BL}$--, therefor.

In Column 8 Line 6, delete "$V_{S\_N2}=V_S=V_{S\_N2}=V_{BL}$" and insert --$V_{S\_N2}=V_S=V_{S\_N1}=V_{BL}$--, therefor.

In Column 8 Line 20, delete "$(V_{G\_N1}=V_{D\_N1})$:" and insert --$(V_{G\_N1}=V_{D\_N2})$:--, therefor.

In Column 8 Line 24, delete "$I_{D\_N1}$" and insert --$I_{D\_N5}$--, therefor.

Signed and Sealed this
Twenty-ninth Day of July, 2014

Michelle K. Lee
*Deputy Director of the United States Patent and Trademark Office*

(12) United States Patent
Fort et al.

(10) Patent No.: US 8,588,021 B2
(45) Date of Patent: *Nov. 19, 2013

(54) SENSE AMPLIFIER APPARATUS AND METHODS

(75) Inventors: Jimmy Fort, Aix en Provence (FR); Thierry Soude, Marseilles (FR); Nicolas Zammit, Aix en Provence (FR)

(73) Assignee: Atmel Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/584,265

(22) Filed: Aug. 13, 2012

(65) Prior Publication Data
US 2012/0300567 A1 Nov. 29, 2012

Related U.S. Application Data

(63) Continuation of application No. 12/492,003, filed on Jun. 25, 2009, now Pat. No. 8,270,242.

(51) Int. Cl.
*G11C 7/02* (2006.01)

(52) U.S. Cl.
USPC .. 365/207; 365/203; 365/185.21; 365/189.07

(58) Field of Classification Search
USPC ............... 365/207, 203, 185.21, 189.07
See application file for complete search history.

(56) References Cited

U.S. PATENT DOCUMENTS

| | | |
|---|---|---|
| 6,191,979 B1 | 2/2001 | Uekubo |
| 6,608,787 B1 | 8/2003 | Daga et al. |
| 8,270,242 B2 * | 9/2012 | Fort et al. ............... 365/207 |
| 2005/0201169 A1 | 9/2005 | Demange et al. |
| 2007/0133316 A1 | 6/2007 | Maejima et al. |

* cited by examiner

*Primary Examiner* — Toan Le
(74) *Attorney, Agent, or Firm* — Fish & Richardson P.C.

(57) ABSTRACT

Some embodiments include apparatus and methods having a sense amplifier unit, a supply node to receive a supply voltage, and a line coupled to a memory cell of a device. The sense amplifier unit includes a circuit path coupled between the supply node and the line to carry a current having a value based on a value of information stored in the memory cell. Additional embodiments are disclosed.

17 Claims, 4 Drawing Sheets